United States Patent
Kilpi et al.

(10) Patent No.: US 12,247,288 B2
(45) Date of Patent: Mar. 11, 2025

(54) SUBSTRATE PROCESSING APPARATUS AND METHOD

(71) Applicant: Picosun Oy, Espoo (FI)

(72) Inventors: Väinö Kilpi, Masala (FI); Tom Blomberg, Masala (FI)

(73) Assignee: Picosun Oy, Espoo (FI)

( * ) Notice: Subject to any disclaimer, the term of this patent is extended or adjusted under 35 U.S.C. 154(b) by 0 days.

(21) Appl. No.: 17/734,615

(22) Filed: May 2, 2022

(65) Prior Publication Data
US 2022/0356575 A1  Nov. 10, 2022

(30) Foreign Application Priority Data
May 10, 2021 (FI) .................................... 20215556

(51) Int. Cl.
| | | |
|---|---|---|
| *C23C 16/458* | (2006.01) | |
| *C23C 16/455* | (2006.01) | |
| *H01L 21/677* | (2006.01) | |
| *H01L 21/687* | (2006.01) | |

(52) U.S. Cl.
CPC .... *C23C 16/4583* (2013.01); *C23C 16/45544* (2013.01); *H01L 21/67748* (2013.01); *H01L 21/6875* (2013.01)

(58) Field of Classification Search
None
See application file for complete search history.

(56) References Cited

U.S. PATENT DOCUMENTS

| | | | | |
|---|---|---|---|---|
| 5,148,714 A | * | 9/1992 | McDiarmid | ........ C23C 16/4584 219/390 |
| 5,156,820 A | * | 10/1992 | Wong | .................... C30B 25/105 392/416 |
| 5,730,801 A | * | 3/1998 | Tepman | ............ H01L 21/67751 156/345.31 |
| 5,772,770 A | * | 6/1998 | Suda | .................... C23C 16/4401 118/725 |

(Continued)

FOREIGN PATENT DOCUMENTS

| | | |
|---|---|---|
| CN | 104812938 A | 7/2015 |
| CN | 110234793 A | 9/2019 |

(Continued)

OTHER PUBLICATIONS

Finnish Patent and Registration Office, Communication of Acceptance, Application No. 20215556 mailed Dec. 8, 2021, 4 pages.

(Continued)

*Primary Examiner* — Karla A Moore
(74) *Attorney, Agent, or Firm* — Espatent Oy

(57) ABSTRACT

A substrate processing apparatus (100), comprising a reaction chamber (20) having an upper portion (20*a*) and a lower portion (20*b*) sealing an inner volume of the reaction chamber (20) for substrate processing, the lower portion (20*b*) being movable apart from the upper portion (20*a*) to form a substrate loading gap therebetween, a substrate support system comprising a support table (31) and at least one support element (70) vertically movable in relation to the support table (31) and extending through the support table (31) to receive a substrate within the reaction chamber (20), and a stopper (90) stopping a downward movement of the at least one support element (70) at a substrate loading level.

13 Claims, 4 Drawing Sheets

(56) References Cited

U.S. PATENT DOCUMENTS

| | | | |
|---|---|---|---|
| 6,315,878 | B1 | 11/2001 | Patadia et al. |
| 6,435,798 | B1* | 8/2002 | Satoh ................ H01L 21/68742 |
| | | | 414/217 |
| 6,527,865 | B1 | 3/2003 | Sajoto et al. |
| 7,959,735 | B2 | 6/2011 | Sterling et al. |
| 9,117,866 | B2 | 8/2015 | Marquardt et al. |
| 11,004,707 | B1* | 5/2021 | Kilpi ..................... C23C 16/511 |
| 2003/0000775 | A1 | 1/2003 | Yudovsky et al. |
| 2004/0177813 | A1 | 9/2004 | Schieve et al. |
| 2005/0039685 | A1 | 2/2005 | Eiriksson et al. |
| 2008/0276958 | A1* | 11/2008 | Mehta ................... B08B 7/0035 |
| | | | 134/1.2 |
| 2010/0101491 | A1* | 4/2010 | Aida ................ H01L 21/68742 |
| | | | 118/502 |
| 2010/0136773 | A1* | 6/2010 | Akae ................... C23C 16/4408 |
| | | | 257/E21.478 |
| 2011/0114014 | A1 | 5/2011 | Sakurai et al. |
| 2012/0231633 | A1 | 9/2012 | Ewert et al. |
| 2013/0287529 | A1 | 10/2013 | Yang et al. |
| 2013/0333616 | A1 | 12/2013 | Klindworth et al. |
| 2014/0007808 | A1 | 1/2014 | Okabe et al. |
| 2016/0010239 | A1 | 1/2016 | Tong et al. |
| 2018/0182660 | A1 | 6/2018 | Ishii et al. |
| 2019/0341233 | A1 | 11/2019 | Nguyen et al. |
| 2019/0390339 | A1* | 12/2019 | Malinen ............ H01L 21/67748 |
| 2020/0344850 | A1* | 10/2020 | Yamaguchi ....... H01L 21/67207 |
| 2020/0411354 | A1 | 12/2020 | Rao et al. |
| 2021/0005505 | A1 | 1/2021 | Wagatsuma et al. |
| 2022/0106705 | A1 | 4/2022 | Narahara et al. |

FOREIGN PATENT DOCUMENTS

| | | |
|---|---|---|
| EP | 0714998 B1 | 10/2001 |
| GB | 1275535 A | 5/1972 |
| JP | 2007503711 | 2/2007 |
| JP | 2010034476 A | 2/2010 |
| JP | 2014514734 A | 6/2014 |
| JP | 2014220427 A | 11/2014 |
| JP | 2017108095 A | 6/2017 |
| JP | 2020004954 A | 1/2020 |
| JP | 2020102589 A | 7/2020 |
| JP | 2021502704 A | 1/2021 |
| KR | 1020050119789 A | 12/2005 |
| KR | 1020210002108 U | 9/2021 |
| TW | 201349377 A | 12/2013 |
| WO | 2005020296 A2 | 3/2005 |
| WO | 2012125469 A2 | 9/2012 |
| WO | 2018146370 A1 | 8/2018 |

OTHER PUBLICATIONS

Finnish Patent and Registration Office, Search Report, Application No. 20215556, mailed Jul. 9, 2021, 2 pages.
International Search Report and Written Opinion, European Patent Office, Application No. PCT/FI2022/050315, Mailed Sep. 9, 2022, 8 pages.
Japan Patent Office, Notification of Rejection, Application No. 2022-071232, mailed Jul. 12, 2022, 2 pages. English Translation, 2 pages.
China State Intellectual Property Office, Search Report, Application No. 2022104830773; Dated Feb. 1, 2023, 2 pages.
China State Intellectual Property Office, Notice of First Office Action, Application No. 20230208018080450, Applicant: Picosun Oy; dated Feb. 8, 2023, 4 pages.
Korean Intellectual Property Office, Notice of Allowance for Patent, Application No. 10-2022-0055863, dated Jan. 26, 2023, 3 pages.
Notice of Comment, JP 10-2022-0055863, Patent Office Mechanical and Metal Technology Examination Bureau, dated Sep. 27, 2022, 6 pages.

* cited by examiner

SUBSTRATE PROCESSING APPARATUS AND METHOD

FIELD OF THE INVENTION

The present invention generally relates to substrate processing apparatus and a method. More particularly, but not exclusively, the invention relates to chemical deposition or etching reactors.

BACKGROUND OF THE INVENTION

This section illustrates useful background information without admission of any technique described herein representative of the state of the art.

In chemical deposition or etching reactors loading of substrates into a reaction chamber may be performed from the side via a gate valve by a loading robot. However, this loading method and all associated substrate handling methods used in the field place certain space limitations on the tool design. In particular, these limitations are observed in the possible design for the reactors. The limitations frequently manifest in challenges in positioning a substrate reception surface at a suitable level within the reactor for adequate reactions to take place while simultaneously enabling sufficient space for the loading robot to operate.

SUMMARY

It is an object of certain embodiments of the invention to provide an improved substrate processing apparatus optimized to address space limitations experienced in practice or at least to provide an alternative solution to existing technology.

According to a first example aspect of the invention there is provided a substrate processing apparatus, comprising:
   a reaction chamber having an upper portion and a lower portion sealing an inner volume of the reaction chamber for substrate processing, the lower portion being movable apart from the upper portion to form a substrate loading gap therebetween;
   a substrate support system comprising a support table and at least one support element vertically movable in relation to the support table and extending through the support table to receive a substrate within the reaction chamber, the apparatus further comprising:
   a stopper stopping a downward movement of the at least one support element at a substrate loading level.

In certain embodiments, the apparatus is configured to move the lower portion with the support table.

In certain embodiments, the apparatus is configured to move the at least one support element downwards with the support table until the at least one support element is stopped by the stopper (or stopping element).

In certain embodiments, the apparatus is configured to move the support table further downwards after the at least one support element has been stopped by the stopper.

In certain embodiments, the apparatus comprises a stationary attachment part supporting the stopper.

In certain embodiments, the stationary attachment part extends from a reaction chamber exhaust line.

In certain embodiments, the apparatus is configured to lift the at least one support element with the support table upwards to a substrate processing position.

In certain embodiments, the support table is configured to elevate the substrate above a bottom surface of the upper portion of the reaction chamber.

In certain embodiments, this lifting occurs after the at least one support element has received the substrate.

In certain embodiments, the support table is attached to the reaction chamber, and the support table and the lower portion of the reaction chamber (e.g., a reaction chamber bowl) are configured to move as one package up-and-down, the at least one support element and the support table are configured to rise together above the substrate loading level, and the at least one support element is configured to stay on the loading level, stopped by the stopper, while the support table is lowered, together with the lower portion, below the loading level.

In certain embodiments, the apparatus comprises an outer chamber at least partly surrounding the reaction chamber. In certain embodiments, the outer chamber is a vacuum chamber.

In certain embodiments, a top surface of the at least one support element resides, in a substrate processing position, higher than the highest spot of a loading opening of a gate valve used by a substrate loading device for loading a substrate.

In certain embodiments, a gate valve is attached to a wall of the outer chamber.

In certain embodiments, the at least one support element is in the form of a pin with an enlarged top.

In certain embodiments, the apparatus is configured to process at least one substrate within the reaction chamber by sequential self-limiting surface reactions.

According to a second example aspect of the invention there is provided a substrate processing apparatus, comprising:
   a reaction chamber having an upper portion and a lower portion sealing an inner volume of the reaction chamber for substrate processing, the lower portion being movable apart from the upper portion to form a substrate loading gap therebetween; and
   a substrate support system comprising a support table adapted to elevate a substrate above a bottom surface of the upper portion of the reaction chamber.

According to a third example aspect of the invention there is provided a method for loading a substrate into a reaction chamber, comprising:
   moving a lower portion of a reaction chamber apart from an upper portion of the reaction chamber to form a substrate loading gap therebetween;
   lowering a substrate support system comprising a support table and at least one support element, wherein the at least one support element is vertically movable in relation to the support table and extending through the support table; and
   stopping the downward movement of the at least one support element by a stopper at a substrate loading level.

In certain embodiments, the method comprises:
   moving the support table further downwards after the at least one support element has been stopped by the stopper (wherein the at least one support element remains at the substrate loading level).

According to a fourth example aspect of the invention there is provided a method for loading a substrate into a reaction chamber, comprising:
   moving a lower portion of a reaction chamber apart from an upper portion of the reaction chamber to form a substrate loading gap therebetween;
   elevating a substrate on a support table above a bottom surface of the upper portion of the reaction chamber, and sealing an inner volume of the reaction chamber by the upper portion and the lower portion for substrate processing.

Different non-binding example aspects and embodiments have been illustrated in the foregoing. The above embodiments are used merely to explain selected aspects or steps that may be utilized in implementations of the present invention. Some embodiments may be presented only with reference to certain example aspects. It should be appreciated that corresponding embodiments apply to other example aspects as well. In particular, the embodiments described in the context of the first aspect are applicable to each further aspect. Any appropriate combinations of the embodiments may be formed.

BRIEF DESCRIPTION OF THE DRAWINGS

The invention will now be described, by way of example only, with reference to the accompanying drawings, in which.

DETAILED DESCRIPTION

Figure 1:
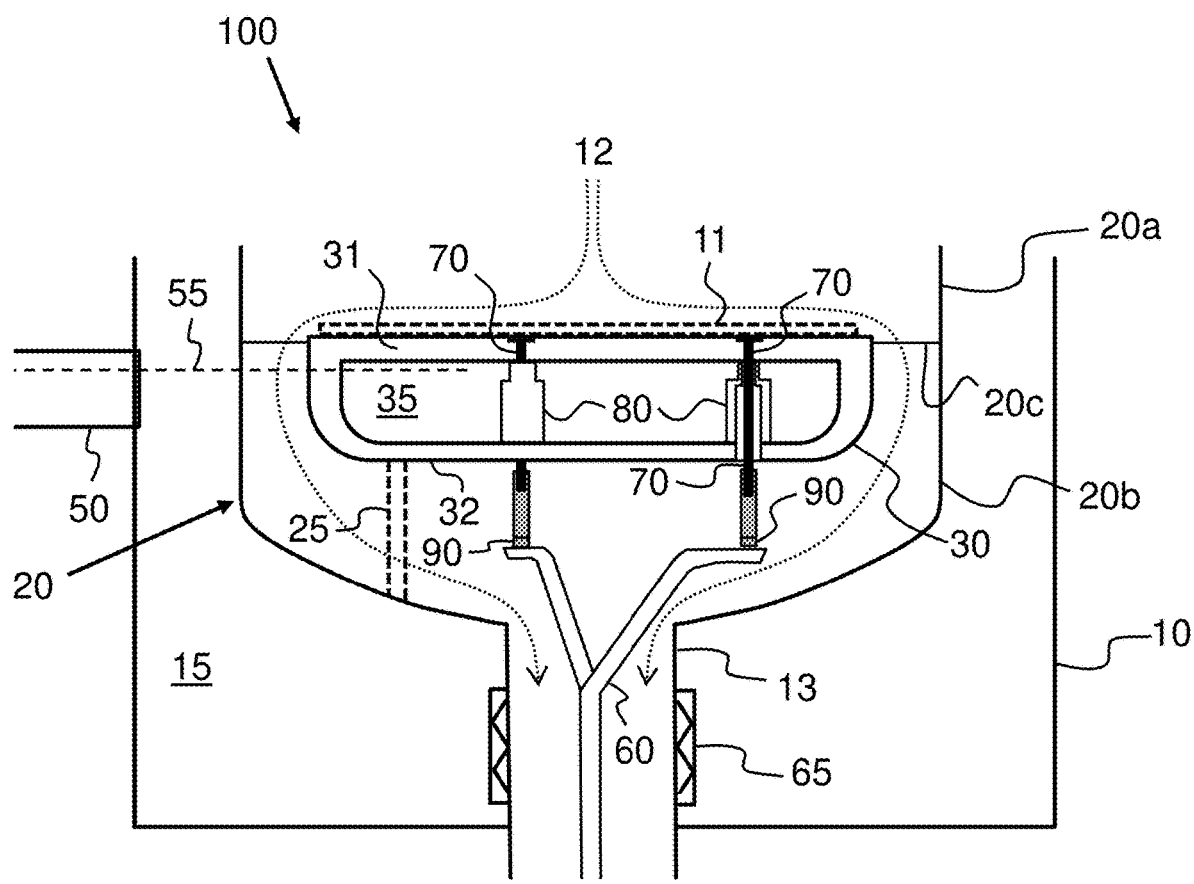
FIG. 1 shows a schematic cross section of a substrate processing apparatus in a substrate processing stage in accordance with certain embodiments.

In the following description, Atomic Layer Deposition (ALD) technology and Atomic Layer Etching (ALE) technology are used as an example.

The basics of an ALD growth mechanism are known to a skilled person. ALD is a special chemical deposition method based on sequential introduction of at least two reactive precursor species to at least one substrate. A basic ALD deposition cycle consists of four sequential steps: pulse A, purge A, pulse B and purge B. Pulse A consists of a first precursor vapor and pulse B of another precursor vapor. Inactive gas and a vacuum pump are typically used for purging gaseous reaction by-products and the residual reactant molecules from the reaction space during purge A and purge B. A deposition sequence comprises at least one deposition cycle. Deposition cycles are repeated until the deposition sequence has produced a thin film or coating of desired thickness. Deposition cycles can also be either simpler or more complex. For example, the cycles can include three or more reactant vapor pulses separated by purging steps, or certain purge steps can be omitted. Or, as for plasma-assisted ALD, for example PEALD (plasma-enhanced atomic layer deposition), or for photon-assisted ALD, one or more of the deposition steps can be assisted by providing required additional energy for surface reactions through plasma or photon in-feed, respectively. Or one of the reactive precursors can be substituted by energy, leading to single precursor ALD processes. Accordingly, the pulse and purge sequence may be different depending on each particular case. The deposition cycles form a timed deposition sequence that is controlled by a logic unit or a microprocessor. Thin films grown by ALD are dense, pinhole free and have uniform thickness.

As for substrate processing steps, the at least one substrate is typically exposed to temporally separated precursor pulses in a reaction vessel (or chamber) to deposit material on the substrate surfaces by sequential self-saturating (or self-limiting) surface reactions. In the context of this application, the term ALD comprises all applicable ALD based techniques and any equivalent or closely related technologies, such as, for example the following ALD sub-types: MLD (Molecular Layer Deposition), plasma-assisted ALD, for example PEALD (Plasma Enhanced Atomic Layer Deposition) and photon-assisted or photon-enhanced Atomic Layer Deposition (known also as flash enhanced ALD or photo-ALD).

However, the invention is not limited to ALD technology, but it can be exploited in a wide variety of substrate processing apparatuses, for example, in Chemical Vapor Deposition (CVD) reactors, or in etching reactors, such as in Atomic Layer Etching (ALE) reactors.

The basics of an ALE etching mechanism are known to a skilled person. ALE is a technique in which material layers are removed from a surface using sequential reaction steps that are self-limiting. A typical ALE etching cycle comprises a modification step to form a reactive layer, and a removal step to take off only the reactive layer. The removal step may comprise using a plasma species, ions in particular, for the layer removal.

In context of ALD and ALE techniques, the self-limiting surface reaction means that the surface reactions on the reactive layer of the surface will stop and self-saturate when the surface reactive sites are entirely depleted.

FIG. 1 shows a schematic cross section of a substrate processing apparatus 100 in a substrate processing stage in accordance with certain embodiments. The substrate processing apparatus 100 may be, for example, an ALD reactor or an ALE reactor. The apparatus 100 comprises a reaction chamber 20, and an outer chamber 10 (or vacuum chamber) at least partly surrounding the reaction chamber 20. An intermediate volume 15 (or intermediate space) is formed in between the reaction chamber 20 and the outer chamber 10. In certain embodiments, the intermediate volume 15 is formed within the outer chamber 10 on the outside of the reaction chamber 20 so that the intermediate volume 15 is defined by both an outer chamber wall and a reaction chamber wall and, accordingly, is formed therebetween.

The apparatus 100 further comprises a substrate support (or substrate support system) 30 within the reaction chamber 20. In certain embodiments, the substrate support 30 is formed as a support table (or substrate supporting table) 31. In certain embodiments, the substrate support 30 comprises the support table 31 and a bottom cover 32. In certain embodiments, the substrate support 30 comprises a hollow inner volume 35. The volume 35 may be defined by or in between the support table 31 and the bottom cover 32.

The reaction chamber 20 in certain embodiments comprises an upper portion 20a and a lower portion 20b sealing an inner volume of the reaction chamber 20 for substrate processing. Further, the upper portion 20a comprises a bottom surface 20c.

A substrate 11 is supported by the substrate support 30 or its support table 31 and processed in vacuum for example by ALD or ALE within the reaction chamber 20. Accordingly, the substrate is exposed to sequential self-limiting surface reactions. The flow geometry within the reaction chamber is shown by arrows 12. Precursor vapor (which includes a plasma species in certain embodiments) approaches the substrate 11 surface from top and exits the reaction chamber 20 from the bottom of the reaction chamber 20 into an exhaust line 13.

The substrate support 30 (or its bottom part or cover 32) is supported from below (or from a side (not shown)) by a connecting (support) part 25 and attached to the lower part 20b. In certain embodiments, the part 25 forms a channel leading from the hollow inner volume 35 to the intermediate volume 15. This enables for example wirings from the support table 31 to be fed through from volume 35 to volume 15 (and from volume 15 via an appropriate outer chamber feedthrough to outside of vacuum) without exposing them to reactants, plasma or precursor vapor, for example.

Figure 2:
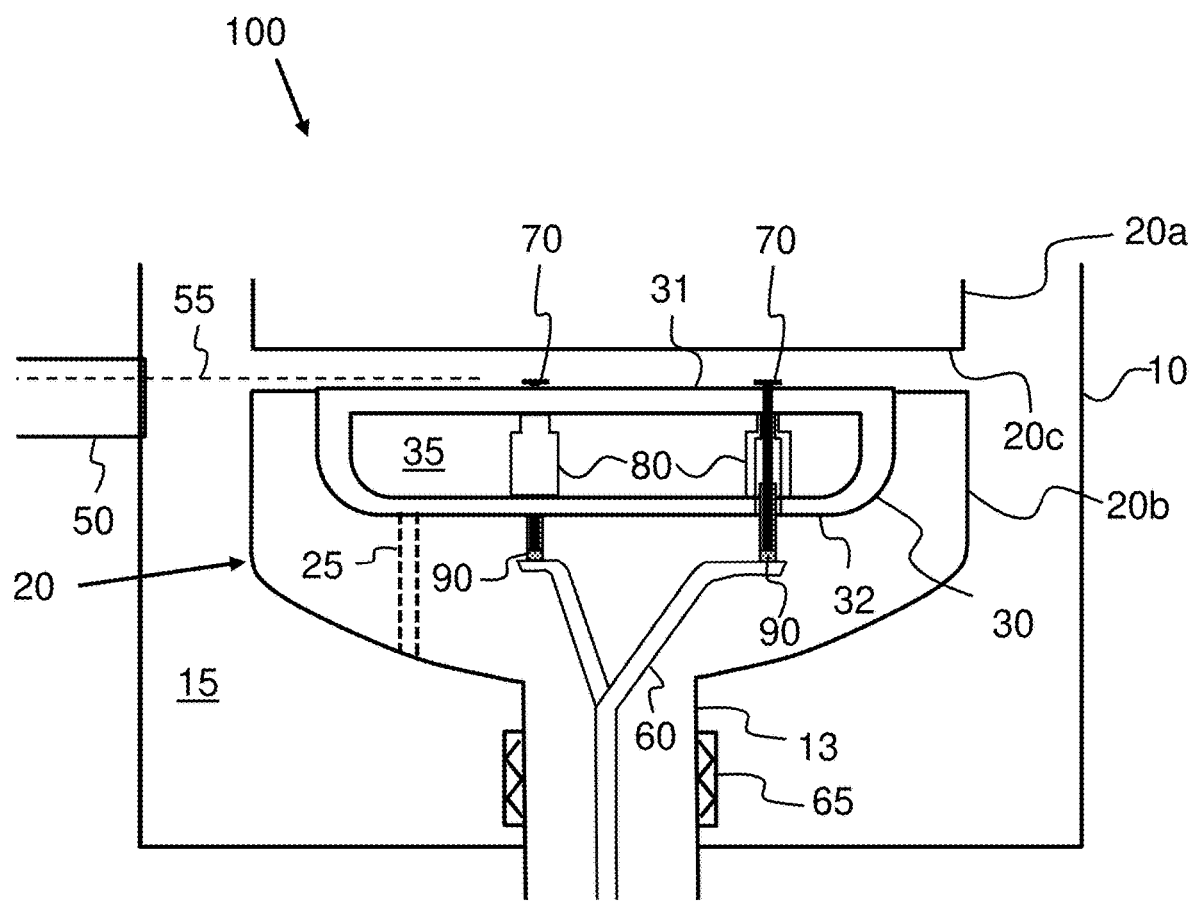
FIG. 2 shows the substrate processing apparatus of FIG. 1 during a substrate loading stage with a lower portion of the reaction chamber in a mid position in accordance with certain embodiments.

In certain embodiments, the substrate support 30 further comprises at least one vertically movable support element (or a set of vertically movable support elements) 70 that extend through the substrate support 30 or through the support table 31, although in certain other embodiments, the elements 70 are adapted to work at the side of the substrate support 30. The elements 70 can move vertically in an enclosure 80 arranged in the substrate support 30. In certain embodiments, the substrate support 30 comprises one or more stoppers 90. In certain embodiments, the one or more stoppers are attached to an attachment part 60. In certain embodiments, the attachment part 60 is a stationary part extending from the exhaust line 13. The stopper(s) 90 stop a downward movement of the elements 70 at a substrate loading level so as will be next demonstrated with the aid of FIGS. 2 and 3.

In certain embodiments, the substrate processing apparatus 100 comprises a gate valve 50 or another device enabling side loading of at least one substrate in vacuum by a loading device, such as a loading robot. In certain embodiments, the gate valve 50 is attached to a wall of the outer chamber 10. The substrate loading level is depicted by arrow 55.

In certain embodiments, the apparatus 100 comprises a part 65 in the exhaust line 13 (on the outside of the reaction chamber 20 and/or inside the intermediate volume 15) allowing lengthening and shortening of the exhaust line 13 by a vertical movement. In certain embodiments, the said part 65 is a vacuum bellows. In certain embodiments, the part 65 is positioned in the portion of the exhaust line 13 facing the intermediate volume 15 (in the outer chamber 10).

Figure 3:
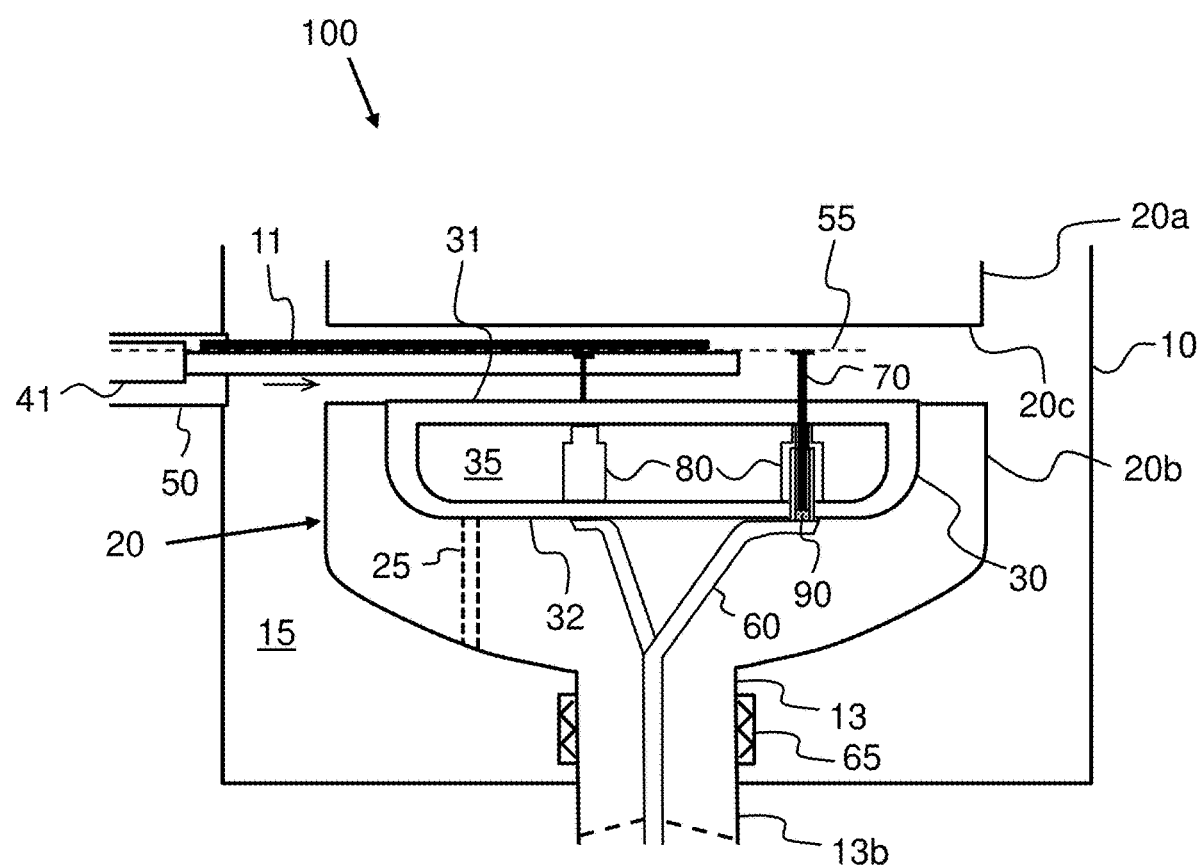
FIG. 3 shows the substrate processing apparatus of FIG. 1 during the substrate loading stage with the lower portion of the reaction chamber in a lowest position in accordance with certain embodiments.

For loading a substrate or wafer into the reaction chamber 20, the lower portion 20b of the reaction chamber 20 (hereinafter: reaction chamber bowl 20b) is moved apart from the upper portion 20a by a lowering movement to form a substrate loading gap therebetween. When moving downwards the elements 70 (which are support pins equipped with enlarged pin tops in certain embodiments) move a short distance with the support table/reaction chamber bowl (31/20b) combination, but the lower end of each pin 70 hits, about in the middle of the stroke, a solid surface of stopper 90 stopping the pin movement and resulting in the pin tops remaining on the loading height of a loading robot. In certain embodiments, the solid surface of stopper 90 is affixed to the attachment part 60. In certain embodiments, the attachment part 60 is affixed to a static part of the exhaust line 13b (as illustrated in FIG. 3). In certain embodiments, the static part of the exhaust line is affixed to the outer chamber 10.

Figure 4:
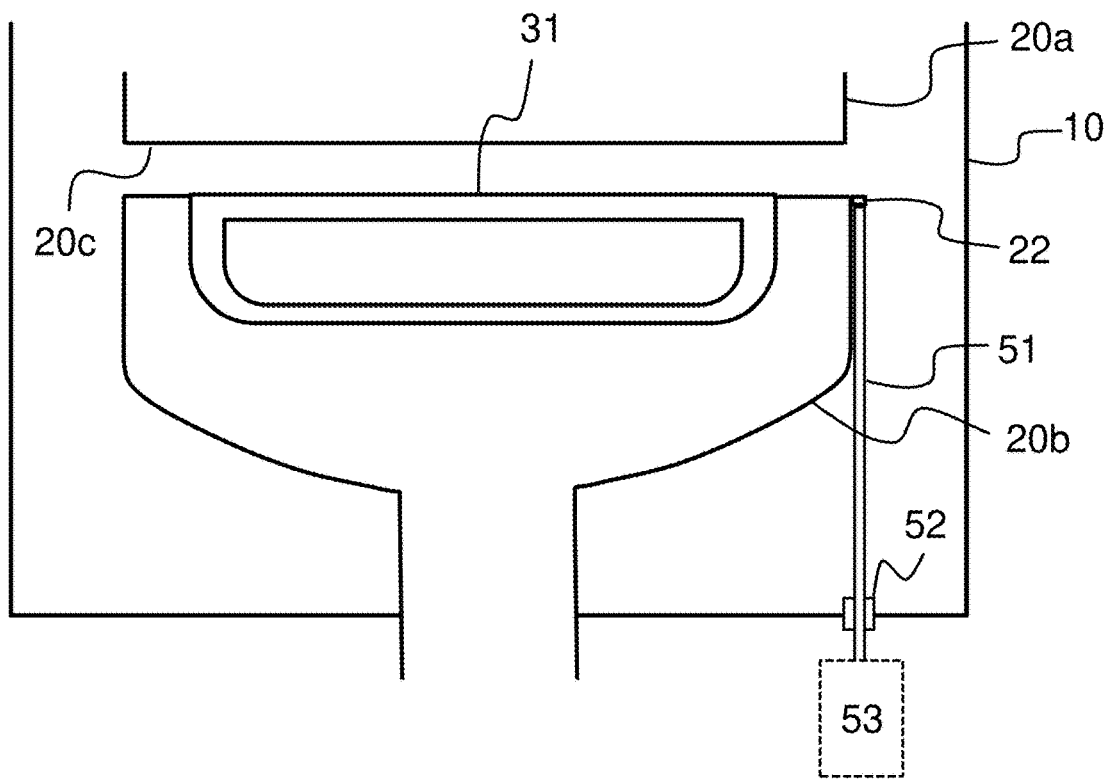
FIG. 4 shows a schematic cross section of an elevator arrangement for the apparatus of FIG. 1 in accordance with certain embodiments.
Figure 5:
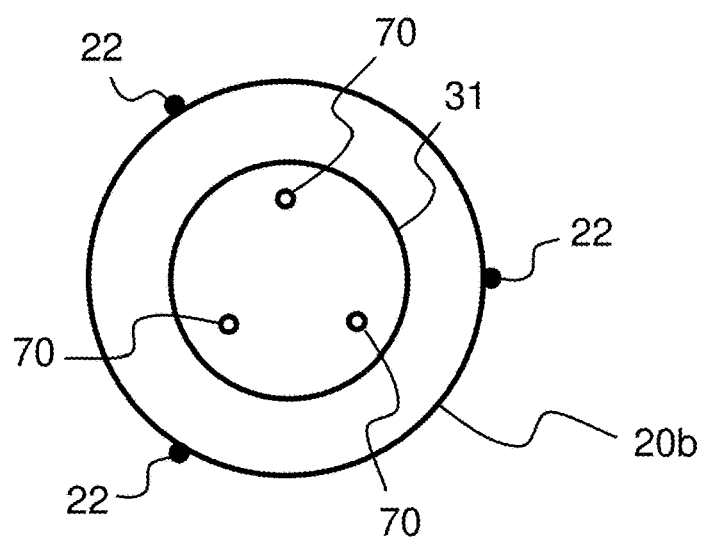
FIG. 5 shows a top view showing pin and elevator attachment point locations in accordance with certain embodiments.

The downward movement of the support table/reaction chamber bowl combination is caused by a lowering movement of an elevator attached to the said combination. In certain embodiments, the lowering movement is brought about by an elevator 53 shown in FIG. 4 and comprising a force transmission element (or rod) 51 extending through an outer chamber feedthrough 52 and attaching to the part 20b or its edge at an attachment point 22. In certain embodiments, the apparatus comprises a plurality of force transmission elements 51 adapted with elevators 53 and attachment points 22. Attachment points 22 may be arranged evenly on the circumference of the bowl 20b. Accordingly, an elevator arrangement with symmetrically positioned attachment (or lifting) points (for example three points) as shown in FIG. 5 may be implemented. Similarly, the elements 70 may be evenly distributed on the support table 31. FIG. 5 shows three elements, which in certain embodiments are pin tops, arranged somewhat equidistant, the distances being approximately at 120 degrees intervals.

The lowering movement of the elements 70 follow the movement of the support table/reaction chamber bowl combination by gravity only. In alternative embodiment, the actuation of the lowering movement is induced or assisted by an actuator or a spring (not shown). After the movement of the element 70 has been stopped, the support table/reaction chamber bowl combination is further moved downwards until a lower (or lowest) position is reached as depicted by FIG. 3. In this way, more room for the loading robot 41 (FIG. 3) may be obtained, and yet the loading of a substrate 11 may be performed, as an example, by only a horizontal movement (or optionally by a horizontal and a lowering movement) of the loading robot 41 along the said substrate loading level 55 via the gate valve 50.

Once the substrate 11 has been placed on the element 70 and the loading robot arm retracted via the gate valve 50, the pin tops remain on the loading height (or level) until the support table (or susceptor plate) 31, on its way up, reaches the substrate 11. The substrate 11 starts to move upwards together with the support table/reaction chamber bowl combination. In certain embodiments, at the end of the upwards movement, the substrate is at a position that is higher than the top surface of the opening of the gate valve 50 used by the loading robot 41 (as shown in FIG. 1). In certain embodiments, at the end of the upwards movement, the substrate is at a position that is higher than the bottom surface 20c of the upper portion 20a of the reaction chamber 20. In certain embodiments, there are no moving parts or contact surfaces above the surface of the wafer. Possible sources of particles that could affect the substrate 11 are thus reduced and a lower count of added particles can be obtained as a result. The elements 70 raise together with the support table/reaction chamber bowl combination as it raises.

Without limiting the scope and interpretation of the patent claims, certain technical effects of one or more of the example embodiments disclosed herein are listed in the following. A technical effect is enabling wafer loading without a separate actuator for wafer supporting pins. A further technical effect is providing adequate room for loading.

The foregoing description has provided by way of non-limiting examples of particular implementations and embodiments of the invention a full and informative description of the best mode presently contemplated by the inventors for carrying out the invention. It is however clear to a person skilled in the art that the invention is not restricted to details of the embodiments presented above, but that it can be implemented in other embodiments using equivalent means without deviating from the characteristics of the invention.

Furthermore, some of the features of the above-disclosed embodiments of this invention may be used to advantage without the corresponding use of other features. As such, the foregoing description should be considered as merely illustrative of the principles of the present invention, and not in limitation thereof. Hence, the scope of the invention is only restricted by the appended patent claims.

The invention claimed is:

1. A substrate processing apparatus, comprising:
a reaction chamber having an upper portion and a lower portion sealing an inner volume of the reaction chamber for substrate processing, the lower portion being movable apart from the upper portion to form a substrate loading gap therebetween;
a substrate support system comprising a support table and at least one support element vertically movable in relation to the support table and extending through the support table to receive a substrate within the reaction chamber, the apparatus further comprising:
a stopper stopping a downward movement of the at least one support element at a substrate loading level, and
a stationary attachment part supporting the stopper,
wherein the upper portion and lower portion are configured to come into contact in order to seal the inner volume, and
wherein the lower portion comprises an exhaust line, wherein the stationary attachment part extends from the exhaust line.

2. The substrate processing apparatus of claim 1, wherein the apparatus is configured to move the lower portion with the support table.

3. The substrate processing apparatus of claim 1, wherein the apparatus is configured to move the at least one support element downwards with the support table until the at least one support element is stopped by the stopper.

4. The substrate processing apparatus of claim 3, wherein the apparatus is configured to move the support table further downwards after the at least one support element has been stopped by the stopper.

5. The substrate processing apparatus of claim 1, wherein the apparatus is configured to lift the at least one support element with the support table upwards to a substrate processing position.

6. The substrate processing apparatus of claim 1, wherein the support table is attached to the reaction chamber and the support table and the lower portion of the reaction chamber are configured to move as one package up-and-down, the at least one support element and the support table are configured to rise together above a substrate loading level, and the at least one support element is configured to stay on the loading level, stopped by the stopper, while the support table is lowered, together with the lower portion, below the loading level.

7. The substrate processing apparatus of claim 1, comprising an outer chamber at least partly surrounding the reaction chamber.

8. The substrate processing apparatus of claim 1, wherein the at least one support element is in the form of a pin with an enlarged top.

9. The substrate processing apparatus of claim 1, configured to process at least one substrate within the reaction chamber by sequential self-limiting surface reactions.

10. The substrate processing apparatus of claim 1, wherein the at least one support element is vertically movable within an enclosure arranged in the substrate support system.

11. The substrate processing apparatus of claim 1, wherein the stopper is configured to remain stationary relative to the upper portion of the reaction chamber.

12. The substrate processing apparatus of claim 1, wherein the at least one support element comprises a pin, the stopper being configured to stop the pin such that a top of the pin remains at a loading height of a loading robot.

13. The substrate processing apparatus of claim 1, wherein the at least one support element is configured to protrude from the support table during loading of a substrate.

* * * * *